United States Patent
Nallan et al.

[11] Patent Number: 6,069,086
[45] Date of Patent: May 30, 2000

[54] NON-HBR SHALLOW TRENCH ISOLATION ETCH PROCESS

[75] Inventors: Padmapani Nallan, Sunnyvale, Calif.; Ganming Zhao, Fukushima, Japan; Jeff Chinn, Foster City; Thalia Kong, San Jose, both of Calif.

[73] Assignee: Applied Materials, Inc., Santa Clara, Calif.

[21] Appl. No.: 09/070,384

[22] Filed: Apr. 30, 1998

[51] Int. Cl.[7] .............................................. H01L 21/3065
[52] U.S. Cl. .......................... 438/706; 713/719; 713/724
[58] Field of Search .................................. 438/700, 701, 438/706, 713, 719, 724

[56] References Cited

U.S. PATENT DOCUMENTS

| | | | |
|---|---|---|---|
| 4,468,285 | 8/1984 | Bayman et al. | 156/643 |
| 5,522,966 | 6/1996 | Komura et al. | 438/701 |
| 5,652,170 | 7/1997 | Keller et al. | 437/60 |
| 5,871,659 | 2/1999 | Sakano et al. | 216/79 |
| 5,900,163 | 5/1999 | Yi et al. | 216/79 |

FOREIGN PATENT DOCUMENTS 06 045290 of 0000 Japan ........................ H01L 31/302

OTHER PUBLICATIONS

EP Search Report PCT/US 99/07919 Jul. 16, 1999.

*Primary Examiner*—Benjamin L. Utech
*Assistant Examiner*—Lynette T. Umez-Eronini
*Attorney, Agent, or Firm*—Birgit Morris

[57] ABSTRACT

An etchant composition for etching straight walled, tapered trenches in silicon comprising chlorine, nitrogen and a mixture of helium and oxygen. The resultant trenches can be readily filled with a dielectric material without the formation of voids. The etchant of the invention is less corrosive, and thus provides increased chamber life and reduced costs over hydrogen bromide-containing etchants.

3 Claims, 1 Drawing Sheet

NON-HBR SHALLOW TRENCH ISOLATION ETCH PROCESS

This invention relates to an etch composition and method for etching trenches in silicon. More particularly, this invention relates to an etch composition that will etch trenches in silicon that avoids the use of hydrogen bromide as part of the etch composition.

BACKGROUND OF THE DISCLOSURE

During state-of-the-art semiconductor processing of semiconductor devices, many devices are made in a single substrate, such as a silicon wafer. These devices are connected to each other by means of conductive lines. However, since these conductive lines can introduce unwanted electric signals in the semiconductor substrate during operation of the devices, the devices are separated from each other by some means of isolation. The usual means of isolation is to etch trenches in the substrate between the devices that can be filled with a dielectric material, such as silicon oxide. Openings in silicon-containing layers, such as polysilicon, are also etched for various semiconductor processes.

Such trenches, since they must later be filled with a dielectric material, must have sidewalls that are straight and smooth to avoid the formation of voids after filling. The bottom of the trench must have a smooth rounded corner between the sidewall and the bottom as well. Further, it is desirable to be able to etch the trench at a reasonably high etch rate.

Various etchants are known for silicon, particularly halogen-containing etchants. Hydrogen bromide (HBr) is known to form deep, straight-walled openings in silicon and polysilicon, but the etch rate is low and HBr is highly corrosive to processing equipment. Thus the equipment, including processing chambers and fixtures, must be re-fitted or even replaced periodically, which adds greatly to the costs of processing semiconductor devices. HBr is also known to cause heavy by-product deposits on the chamber walls, necessitating frequent wet cleaning of the chamber.

Chlorine has also been used as an etchant, but chlorine alone is isotropic, and straight walled openings with smooth bottoms cannot be maintained. Further, the etch rate is low. Oxygen has been added to chlorine for etching trenches, which increases the etch rate, but it is very difficult to obtain the very tapered sidewalls that are needed for void-free filling purposes.

Thus an etchant mixture of chlorine, HBr and oxygen has been employed for etching shallow trenches. A typical hydrogen bromide (HBr) etch of silicon comprises passing 90 sccm of HBr, 20 sccm of chlorine and 15 sccm of a helium/oxygen mixture containing 30% of oxygen into the processing chamber. When the above etch mixture is used at 40 millitorr pressure using 275 watts of bias power to the substrate support and 1500 watts of power to the chamber, the chamber must be cleaned after processing about 100 wafers. This etchant mixture provides good profile control and the sidewalls are straight and smooth. However, since the etchant includes HBr, it is still highly corrosive and the chamber must be cleaned or refitted frequently.

Thus an etchant that will produce trench openings in silicon that have straight, smooth walls, rounded bottoms and a reasonable etch rate, but that avoids the use of HBr, would be highly desirable.

SUMMARY OF THE INVENTION

The present invention is directed to a trench etch mixture comprising chlorine, nitrogen and a helium/oxygen mixture. This etch mixture can etch trenches with good profile control and rounded bottoms, but is not as corrosive to expensive vacuum etch chambers because it does not include HBr.

DETAILED DESCRIPTION OF THE INVENTION

Figure 1:
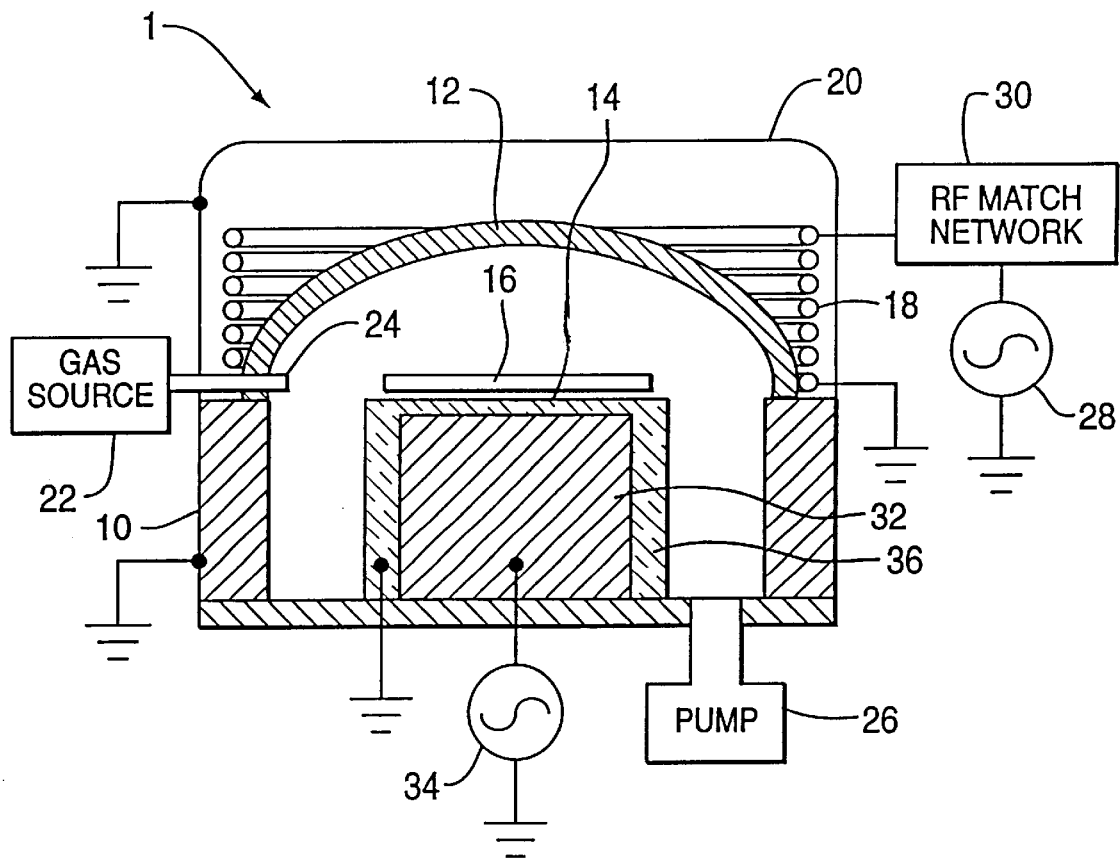
FIG. 1 is a schematic cross sectional view of a plasma reactor in which the present etch of silicon or polysilicon can be carried out.

The present etch can be carried out suitably in a plasma reactor such as is shown in FIG. 1. This chamber is known as a decoupled plasma source chamber. Referring to FIG. 1, an inductively coupled RF plasma reactor includes a reactor chamber 1 having a grounded conductive cylindrical sidewall 10 and a shaped dielectric ceiling 12, e.g., dome-like. The reactor includes a substrate pedestal 14 for supporting a semiconductor substrate 16 in the center of the chamber 1; a cylindrical inductor coil 18 surrounding an upper portion of the chamber beginning near the plane of the top of the substrate or substrate pedestal 14 and extending upwardly therefrom toward the top of the chamber 1; a process gas source 22 and a gas inlet 24 for process gas to be furnished to the interior of the chamber 1, which can be a plurality of inlets spaced about the chamber 1; and a pump 26 for controlling the chamber pressure. The coil inductor 18 is energized by a plasma source power supply, or RF generator 28, through a conventional active RF match network 30, the top winding of the coil inductor 18 being "hot" and the bottom winding being grounded. The substrate pedestal 14 includes an interior conductive portion 32 connected to a bias RF power supply or generator 34, and an exterior grounded conductor 36 (insulated from the interior conductive portion 32). A conductive grounded RF shield 20 surrounds the coil inductor 18.

In accordance with one aspect of the chamber 1, uniformity of the plasma density spatial distribution across the substrate is improved by shaping the ceiling 12 as a multi-radius dome and individually determining or adjusting each one of the multiple radii of the ceiling 12. The multiple radius dome shape in the embodiment of FIG. 1 somewhat flattens the curvature of the dome ceiling 12 around the center portion of the dome, the peripheral portion of the dome having a steeper curvature.

During processing, the power sources are turned on and processing gas passed into the chamber 1, forming a high density plasma in the chamber 1. The power to the chamber 1 from the inductive RF power source 28 is suitably up to about 3000 watts. The RF source can be a 13.56 MHz power source. The bias power to the substrate support 14 can vary up to 1000 watts, which provides a good etch rate. The bias frequency can vary from about 400 kHz up to about 13.56 MHz, but is preferably about 400 kHz. This provides improved profile control. However, the above frequencies are given for purposes of illustration only and different frequencies can be used. Frequencies as low as 50 kHz and up to 13.56 MHz and multiples thereof can be employed.

The pressure in the chamber during processing is important; generally the etch rate increases with pressure, but at higher pressures the selectivity to the etch mask decreases, as does the etch rate. Thus if the pressure is too high, it is difficult to control the sidewall taper, and the etch becomes more isotropic. Preferably a pressure of about 4 to 70 millitorr is used.

The power to the chamber 1 from the inductive coil power source is suitably about 400–2000 watts. The bias power to the substrate support can vary from about 20 to 500 watts.

The substrate is cooled during etch processing, generally by means of a coolant passed to a channel in the substrate support electrode (not shown). In addition, a flow of a coolant such as helium can be passed between the substrate and the substrate support to enhance cooling and maintain the temperature of the substrate within the desired range, generally 0 to about 65° C.

Although the above-described processing chamber provides excellent results, other known vacuum etch chambers can also be employed.

The present etchant mixture of chlorine, nitrogen and oxygen, in the form of a 70:30 mixture of helium and oxygen to dilute the oxygen, forms straight walled openings with smooth bottoms.

Although the exact mechanism of the present etchant mixture and method is not known with certainty, it is known that chlorine alone does not produce smooth sidewall openings in silicon and that the addition of HBr to chlorine provides a passivating coating on the sidewalls of the growing trench that prevents isotropic etching of the sidewalls. In the present case it is believed that nitrogen also provides a passivating coating on the trench sidewalls, possibly a silicon oxynitride. However, in order to obtain rounded trench bottoms, a mixture of helium and oxygen is also added to the etchant mixture to dilute the oxygen. Generally suitable is a mixture containing about 30% by volume of oxygen.

The relative amounts of chlorine, nitrogen and oxygen can vary from: chlorine, 20–200 scam; nitrogen, 2–50 scam and helium/oxygen, 2–50 scam. The preferred ratio of chlorine to oxygen is from about 2:1 to about 20:1. The preferred ratio of chlorine to nitrogen is from about 2:1 to about 20:1.

The invention will be further described in the following Control and Example, although the invention is not meant to be limited by the details described therein.

Control

A substrate having a layer of silicon nitride over a layer of silicon dioxide and a polysilicon layer having a patterned mask layer thereover was processed in a chamber as in FIG. 1. A fluorocarbon cleaning step was carried out in the chamber for about 10 seconds using 500 watts of power to the coil. The bias power was 40 watts, and the pressure in the chamber was held at 4 millitorr. A flow of 50 scam of $CF_4$ was passed into the chamber for 10 seconds for this cleaning step.

During the etch step, the dome temperature was held at 80° C.; the cathode temperature was held at 45° C.; and the chamber wall temperature was held at 65° C. Helium cooling gas was passed between the substrate and the substrate support at a pressure of 8 torr.

A 35 second etch was carried out by increasing the source power to 1500 watts and increasing the bias power to the substrate to 275 watts. The pressure in the chamber was increased to 40 millitorr. The etch was carried out by passing 90 sccm of chlorine and 15 sccm of a $He/O_2$ mixture containing 30% of oxygen.

The resultant etched trench had a depth of about 3750 Å, and a sidewall angle of 82° with respect to the plane of the substrate. The silicon etch rate was 6420 Å/min, and the etch rate microloading was less than 2% across the wafer. The selectivity of silicon to the silicon nitride substrate was 10:1.

EXAMPLE

The Control was repeated except that 10 sccm of nitrogen was also passed into the chamber during the etch step.

The etch rate was 6482 Å/min and the sidewall angle was 78°, somewhat more tapered. The microloading was still less than 2% and the selectivity between silicon and silicon nitride was 9.5:1.

Although the invention has been illustrated in terms of specific embodiments, variations can be made as will be known to one skilled in the art. The invention is only meant to be limited by the appended claims.

What is claimed is:

1. A method of anisotropically etching tapered openings in a silicon substrate selectively over a silicon nitride layer comprising passing a mixture of chlorine, oxygen and nitrogen into a vacuum chamber and forming a plasma therefrom, wherein the ratio of chlorine to oxygen is from about 2:1 to about 20:1 and the ratio of chlorine to nitrogen is from about 2:1 to about 20:1.

2. A method according to claim 1 wherein said mixture additionally includes helium.

3. A method according to claim 1, wherein the etch method is carried out in a decoupled plasma source reactor.

* * * * *